US010516224B1

(12) United States Patent
Taylor (10) Patent No.: US 10,516,224 B1
(45) Date of Patent: Dec. 24, 2019

(54) EDGE LAUNCH CONNECTOR FOR ELECTRONICS ASSEMBLIES (71) Applicant: Raytheon Company, Waltham, MA (US)

(72) Inventor: Brian L. Taylor, Anna, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/231,376

(22) Filed: Dec. 21, 2018

(51) Int. Cl.
*H01R 12/72* (2011.01)
*H01R 13/6471* (2011.01)
*H01R 13/17* (2006.01)
*H01R 13/631* (2006.01)
*H01R 43/26* (2006.01)
*H05K 1/11* (2006.01)
*H05K 1/02* (2006.01)
*H05K 1/18* (2006.01)
*H05K 1/14* (2006.01)

(52) U.S. Cl.
CPC .......... *H01R 12/727* (2013.01); *H01R 13/17* (2013.01); *H01R 13/6315* (2013.01); *H01R 13/6471* (2013.01); *H01R 43/26* (2013.01); *H05K 1/0243* (2013.01); *H05K 1/111* (2013.01); *H05K 1/14* (2013.01); *H05K 1/181* (2013.01); *H05K 2201/10098* (2013.01); *H05K 2201/10189* (2013.01)

(58) Field of Classification Search
CPC ...... H01R 12/727; H01R 13/17; H01R 13/18; H01R 13/187; H01R 13/193; H01R 13/6315; H01R 13/6471; H01R 43/26; H01R 43/243; H05K 1/0243; H05K 1/111; H05K 1/11; H05K 1/14; H05K 1/181; H05K 2201/10189; H05K 2201/10098
USPC .......................................................... 439/63
See application file for complete search history.

(56) References Cited

U.S. PATENT DOCUMENTS

| 4,820,185 A | 4/1989 | Moulin |
| 5,265,182 A | 11/1993 | Hartley |
| 5,928,000 A | 7/1999 | Rudisill et al. |
| 6,166,615 A | 12/2000 | Winslow et al. |

(Continued)

OTHER PUBLICATIONS

Delta Electronics Mfg. Corp., SMP/SMPM High Performance Connectors to GHz, https://deltarf.com/pdf/DeltaSMP_SMPM.pdf, to the best of applicant's knowledge article was available before the application filing date, 28 pages, Delta Electronics Mfg. Corp. Beverly, MA.

*Primary Examiner* — Harshad C Patel (57) ABSTRACT

An edge launch signal connector (e.g., RF connector) comprises a connector body having a support aperture, and one or more interface surfaces operable to interface with an edge launch connector support portion of a first circuit board. A plurality of ground contact pins can be supported by the connector body and can be arrayed about the support aperture of the connector body, and a signal pin can be supported within the support aperture. In response to the edge launch signal connector engaging a second circuit board, the signal pin interfaces with a signal contact pad of the second circuit board, and the plurality of ground contact pins interface with at least one ground contact pad. A first circuit board assembly can support a plurality of edge launch signal connectors for blind-mate coupling first and second circuit board assemblies together to accommodate for positional tolerances.

20 Claims, 6 Drawing Sheets

(56) References Cited

U.S. PATENT DOCUMENTS

| | | | |
|---|---|---|---|
| 7,097,499 B1 | 8/2006 | Purdy | |
| 7,704,077 B1 * | 4/2010 | Morley | H01R 24/50 |
| | | | 439/63 |
| 7,802,994 B1 * | 9/2010 | Chen | H01R 12/58 |
| | | | 439/65 |
| 7,946,853 B2 * | 5/2011 | Breinlinger | H01R 13/2407 |
| | | | 439/581 |
| 7,959,445 B1 * | 6/2011 | Daily | H01R 12/716 |
| | | | 439/65 |
| 8,382,488 B2 * | 2/2013 | Uesaka | H01R 13/2421 |
| | | | 439/581 |
| 8,690,583 B2 * | 4/2014 | Uesaka | H01R 12/714 |
| | | | 439/63 |
| 8,740,642 B2 * | 6/2014 | Keenihan | H01R 31/00 |
| | | | 439/510 |
| 8,899,992 B2 * | 12/2014 | Yang | H01R 24/46 |
| | | | 439/63 |
| 8,944,827 B2 * | 2/2015 | Ohsaka | H01R 12/57 |
| | | | 439/581 |
| 9,166,327 B2 * | 10/2015 | Yu | H01R 13/46 |
| 9,590,344 B2 * | 3/2017 | Krishnamoorthy | H01R 12/732 |
| 9,590,359 B1 * | 3/2017 | Patterson | H01R 13/6473 |
| 2002/0098720 A1 * | 7/2002 | Noda | H01R 24/50 |
| | | | 439/63 |
| 2010/0248503 A1 * | 9/2010 | Kang | H01R 24/50 |
| | | | 439/63 |
| 2013/0330944 A1 | 12/2013 | Rucki et al. | |

* cited by examiner

EDGE LAUNCH CONNECTOR FOR ELECTRONICS ASSEMBLIES

BACKGROUND

Traditional radio frequency (RF) interconnects consist of three parts, namely, an RF connector body supported by a first substrate, an RF signal connector supported by the RF connector body, and another RF connector body, otherwise known as a "bullet," soldered to a second substrate for connection to the RF signal connector. In some assemblies or systems, such as larger active scanned arrays (AESA), dozens or hundreds of such 3-part RF interconnects may be provided between a plurality of circuit board assemblies (e.g., CCAs) and a circuit board of a primary electronics assembly, which can be very costly. In some instances, each CCA (e.g., transmit/receive integrated multichannel modules (TRIMMS)) may have two or more RF connections. The 3-part RF interconnect of such CCAs can suffer from improper connection because of positional tolerances that may exist due to the presence of other electrical connections between the CCAs and the primary electronics assembly. These positional tolerance variations can result in undesirable axial and/or radial misalignment between the RF connector bodies of two or more RF connections of a particular CCA, such that the RF interconnects may not make proper connection between each other, and/or may place strain on the connector bodies which can result in damage, or even ineffective signal transfer.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein.

Reference will now be made to the exemplary embodiments illustrated, and specific language will be used herein to describe the same. It will nevertheless be understood that no limitation of the scope of the invention is thereby intended.

DETAILED DESCRIPTION

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

An initial overview of the inventive concepts are provided below and then specific examples are described in further detail later. This initial summary is intended to aid readers in understanding the examples more quickly, but is not intended to identify key features or essential features of the examples, nor is it intended to limit the scope of the claimed subject matter.

As mentioned above, in prior systems or assemblies, when coupling circuit boards together (e.g., one or more CCAs to a primary electronics assembly), positional tolerances can prove problematic due to the amount of connections between the circuit boards, particularly when a plurality of RF connections must be made between the circuit boards. Unlike prior systems and assemblies, the present disclosure sets forth an edge launch RF signal connector comprising: a connector body having a support aperture (e.g., a central support aperture), and one or more interface surfaces operable to interface with an edge launch connector support portion of a first circuit board. A plurality of ground contact pins can be supported by the connector body and can be arrayed about the support aperture of the connector body. Each ground contact pin can comprise a contact tip and a compliant device operable to facilitate axial movement of the ground contact tip relative to the connector body. A signal pin (e.g., a signal pin centrally located relative to the plurality of ground contact pins) can be supported within the support aperture of the connector body, and the signal pin can comprise a contact tip and a compliant device operable to facilitate axial movement of the contact tip. In response to the edge launch RF signal connector engaging a second circuit board, the signal pin interfaces with a signal contact pad of the second circuit board, and the plurality of ground contact pins interface with at least one ground contact pad of the second circuit board.

The present disclosure sets forth an electronics assembly having at least one edge launch RF signal connector that accounts for positional tolerances between connected circuit boards. The electronics assembly can comprise a first circuit board assembly comprising at least one edge launch connector support portion; a second circuit board assembly comprising at least one signal contact pad and at least one ground contact pad surrounding the signal contact pad, the first circuit board assembly being blind-mate connected to the second circuit board assembly; and an edge launch RF signal connector that facilitates the blind-mate connection of the first and second circuit board assemblies, the edge launch RF signal connector comprising a connector body supported by the connector support portion of the first circuit board assembly, the connector body supporting a plurality of ground contact pins biased to the at least one ground contact pad via a spring force, and supporting a signal pin biased to the signal contact pad via a spring force, to account for positional tolerances between the first and second circuit board assemblies.

The electronics assembly can further comprise a contact tolerance float system at least partially defined by the ground contact spring pins and the central signal spring pin to account for positional tolerances between the first and second circuit board assemblies upon being blind-mate connected to each other. The contact tolerance float system can comprise the plurality of ground contact pins, wherein each ground contact pin comprises a contact tip and a compliant device operable provide a respective spring force, and to facilitate axial movement of the ground contact tip relative to the connector body; and the signal pin, wherein the signal pin further comprises a contact tip and a compliant device operable to facilitate axial movement of the contact tip to apply the spring force, wherein the ground contact pins and the signal pin are at least partially compressed to facilitate axial float between the first and second circuit board assemblies along an axis normal to a surface of the second circuit board assembly, thereby accounting for axial positional tolerances.

The contact tolerance float system can further comprise the at least one ground contact pad, wherein the plurality of ground contact pins interface with the at least one ground contact pad to provide a plurality of ground electro-mechanical interfaces; and the signal pad, wherein the signal pin interfaces with the signal pad to provide a signal electro-mechanical interface, wherein the ground electro-mechanical interfaces and the signal electro-mechanical interface facilitate radial float between the first and second circuit board assemblies in different directions along different axes parallel to the surface of the second circuit board assembly, thereby accounting for radial positional tolerances.

The present disclosure sets forth a method for accounting for positional tolerances between blind-mated circuit boards with edge launch RF signal connectors, comprising coupling at least one edge launch RF signal connector to a first circuit board assembly, the at least one edge launch RF signal connector comprising a connector body supporting a plurality of ground contact pins and a signal pin each having contact tips operable to axially move via a compliant device in response to a biasing force; obtaining a second circuit board assembly having a printed circuit board substrate comprising at least one ground contact pad and a signal contact pad; and interfacing the signal pin to the signal contact pad, and interfacing the ground contact pins to the at least one ground contact pad, such that the contact tips of the signal pin and the ground contact pins axial move via the compliant devices while blind-mate coupling the first circuit board assembly to the second circuit board assembly to accommodate for positional tolerances.

Figure 1A:
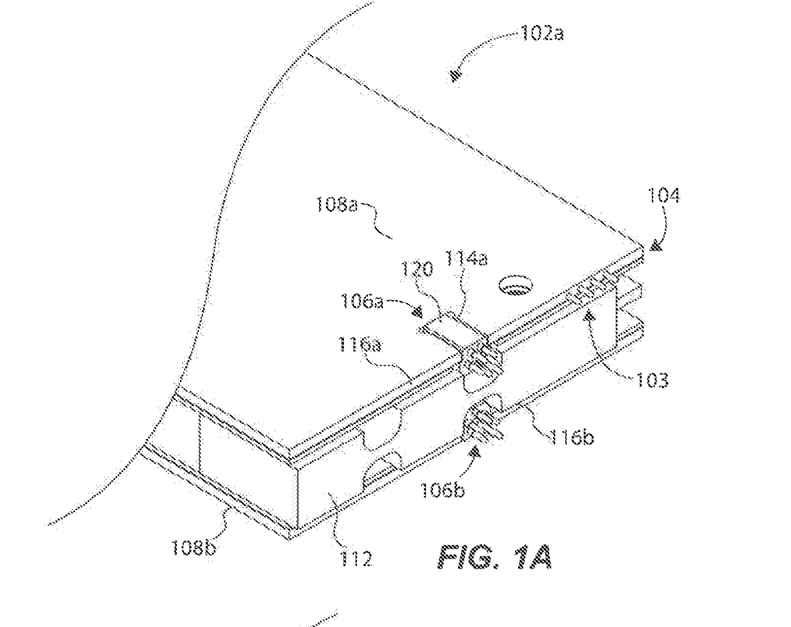
FIG. 1A is an isometric view of a portion of a circuit board assembly supporting a pair of edge launch RF signal connectors, in accordance with an example of the present disclosure.
Figure 1B:
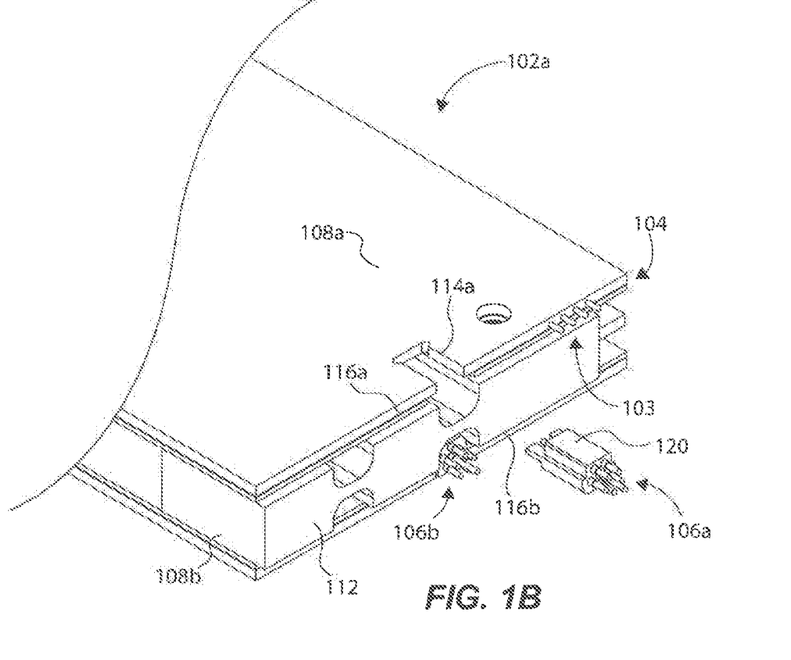
FIG. 1B is the isometric view of the circuit board assembly, and showing one of the edge launch RF signal connectors exploded from the circuit board assembly.
Figure 4A:
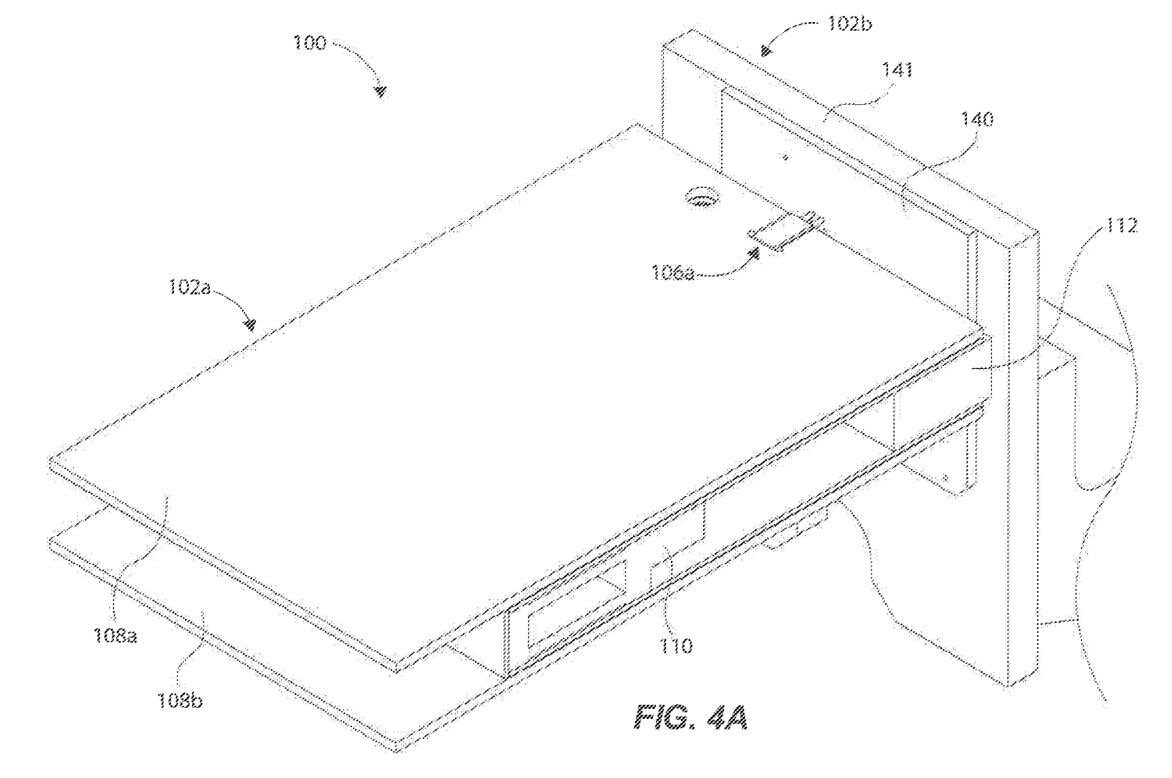
FIG. 4A is an isometric view of the circuit board assembly of FIG. 1A blind-mate coupled to a circuit board of a primary electronics assembly, in accordance with an example of the present disclosure.
Figure 4B:
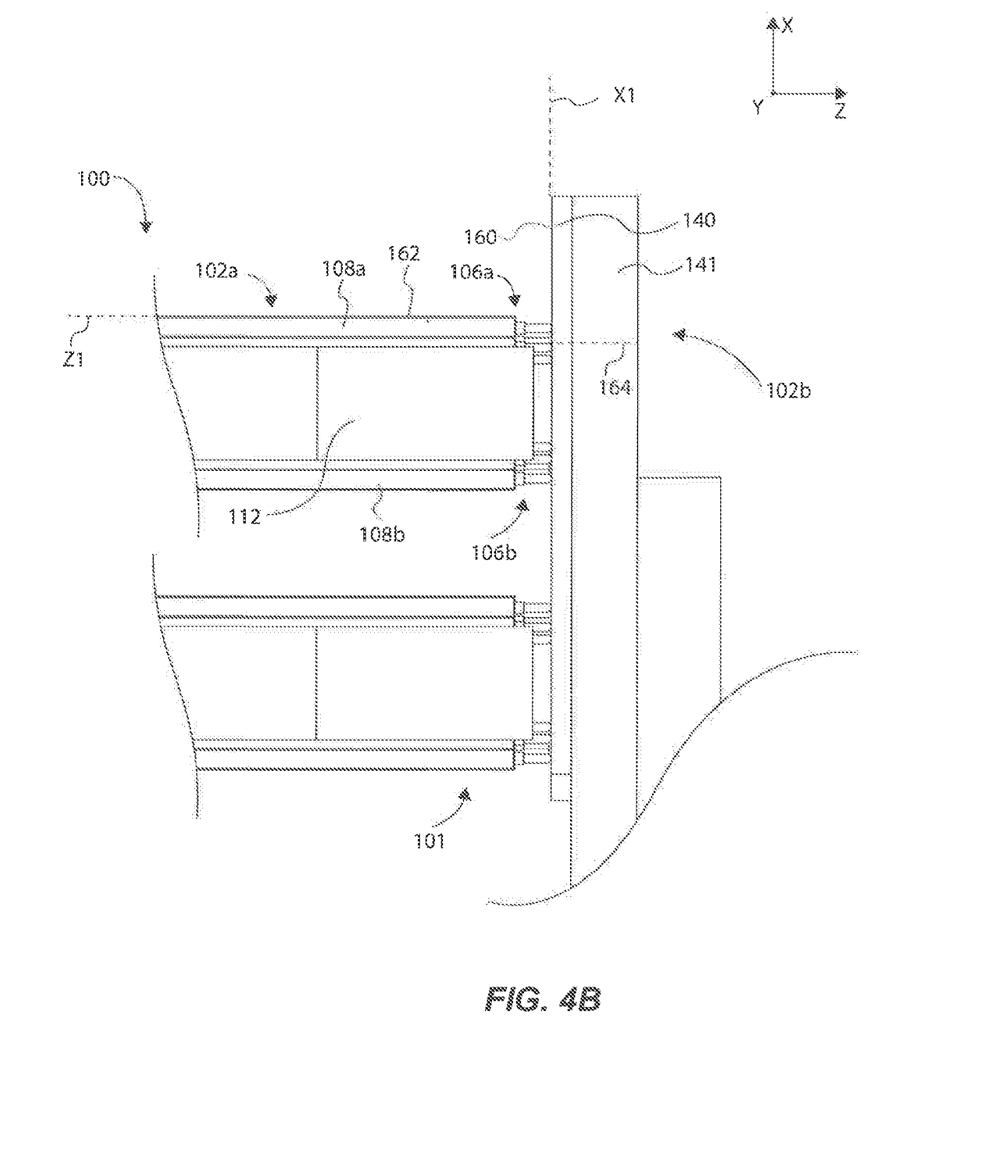
FIG. 4B is a side view of a plurality of circuit board assemblies similar to the circuit board assembly of FIG. 1A, the plurality of circuit board assemblies being blind-mate coupled to the circuit board of the primary electronics assembly of FIG. 4A, this view further showing a section of the blind-mate coupling area between the circuit board assemblies.

To further describe the present technology, examples are now provided with reference to the figures. FIGS. 1A-6B show various aspects of an example electronics assembly having at least one edge launch RF signal connector to account for positional tolerances between connected circuit boards. In one example, a primary electronics assembly 100 (or a portion thereof), as shown assembled in FIG. 4A, includes a first circuit board assembly 102a and a second circuit board assembly 102b blind-mate coupled to each other via a number of electrical contacts and their associated interfaces. FIGS. 1A and 1B show aspects of the first circuit board assembly 102a. In one example application, the electronics assembly 100 can be part of, or comprise, an antenna array assembly (e.g., active scanned array), where the first circuit board assembly 102a is one of a plurality of similar circuit card assemblies, such as transmit/receive integrated multichannel modules (TRIMMS) that include antenna components for transmitting/receiving radio frequency signals. For instance, FIG. 4B shows the first circuit board assembly 102a and another/similar circuit board assembly 101 oriented generally parallel to each other and each blind-mate coupled to the second circuit board assembly 102b of the primary electronics assembly 100 (e.g., an antenna array device).

The first circuit board assembly 102a (and the circuit board assembly 101) can be oriented transverse (e.g., generally orthogonal) relative to the second circuit board assembly 102b of a primary electronics assembly (e.g., such as an electronics assembly of an antenna array device). In this manner, the electrical connections of the first circuit board assembly 102a can be "edge launch" connections or connectors that interface to contacts (e.g., pads) of the second circuit board assembly 102b, such as shown and described regarding FIGS. 5A and 5B. Thus, as shown in FIG. 1A, a number of peripheral electrical contacts 103 (e.g., male or protruding pins) may extend outwardly and along a first edge portion or area 104 of the first circuit board assembly 102a for electrically coupling to receiving contact interfaces (e.g., female sockets or other pin receiving contact components) of the second circuit board assembly 102b. The peripheral contacts 103 are operable to contact respective contact interfaces within the positional tolerances accounted for by the edge launch RF signal connector(s), as further detailed below.

In one example, the first circuit board assembly 102a may include first and second edge launch connectors 106a and 106b supported by the first circuit board assembly 102a (or the first circuit board assembly 102a can comprise a single edge launch connector or more than two edge launch connectors). The edge launch connectors 106a and 106b may be configured to transfer RF signals between the first and second circuit board assemblies 102a and 102b. Therefore, the edge launch connectors 106a and 106b can replace traditional 3-part RF connectors, as noted above, and can also eliminate the need for solder points that attach the traditional "bullet" to a substrate, as further discussed below.

Figure 2:
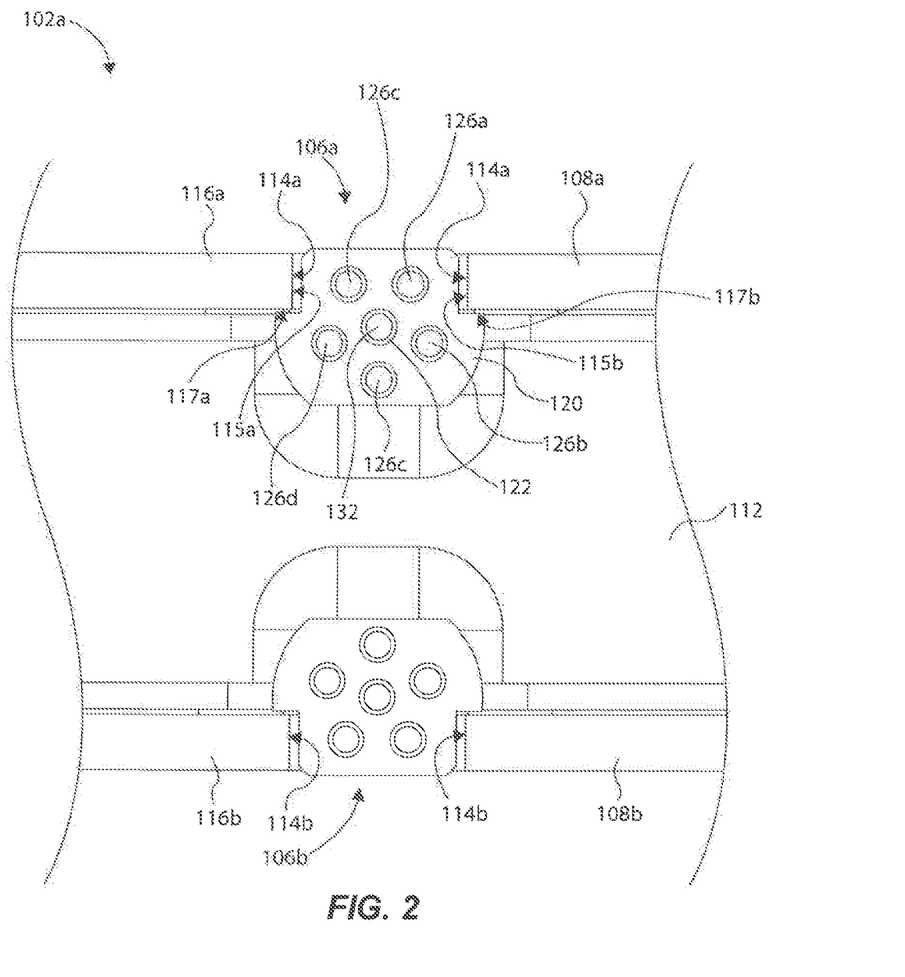
FIG. 2 is a bottom edge view of a section of the circuit board assembly of FIG. 1A.

As best shown in FIGS. 1A-2, the first circuit board assembly 102a can comprise a first substrate 108a and a second substrate 108b spatially separated and generally parallel to each other, and which can be coupled together by a coldplate (e.g., a brazed fluid coldplate) electronics component 110 (FIG. 4) and a heatsink 112. The first and second substrates 108a and 108b can each comprise printed circuit boards having a number of printed traces, contacts, electronics devices, etc., such as provided with traditional CCAs that may be part of an electronics assembly, such as an antenna array assembly. Each of the first and second substrates 108a and 108b can comprise an edge launch connector support portion 114a and 114b that are formed as recesses or slots into respective edge areas 116a and 116b of the first and second substrates 108a and 108b. In this manner, the edge launch connector support portions 114a and 114b and the respective first and second substrates 108a and 108b can structurally support respective edge launch connectors 106a and 106b.

Figure 3A:
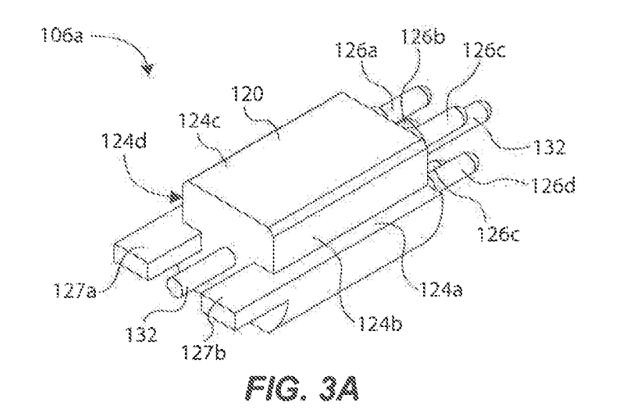
FIG. 3A is an first isometric view of the edge launch RF signal connector of FIG. 1A.
Figure 3B:
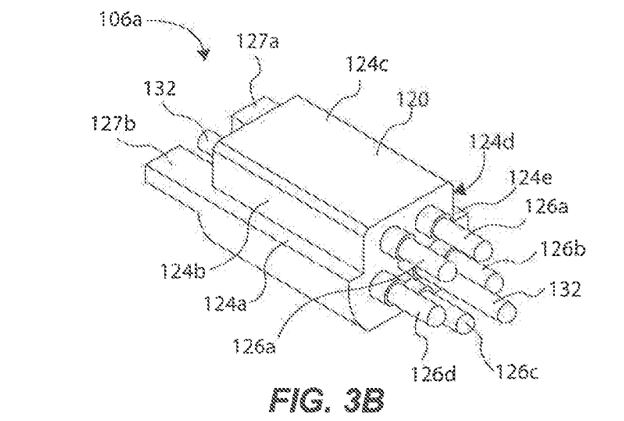
FIG. 3B is a second isometric view of the edge launch RF signal connector of FIG. 1A.
Figure 3C:
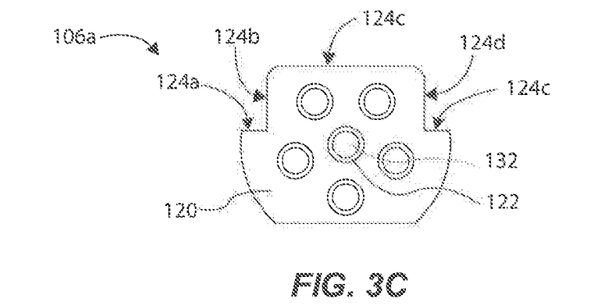
FIG. 3C is a front view of the edge launch RF signal connector of FIG. 1A.

Turning to the details of the edge launch connectors 106a and 106b, FIGS. 3A-3C show closer views of the exemplary edge launch connector 106a (the edge launch connectors 106a and 106b each comprising a similar configuration). In the example shown, the edge launch connector 106a comprises a connector body 120 having a central support aperture 122, and one or more interface surfaces 124a-e operable to interface with the edge launch connector support portion 114a of the first substrate 108a (FIG. 2). Note that the edge launch connector support portion 114a, as shown in FIG. 2, can comprise opposing connector support surfaces 115a and 115b, and inner connector support surfaces 117a and 117b, which interface with and support respective interface surfaces 124a-e of the connector body 120. The connector body 120 can further comprise support tabs 127a and 127b sized and shaped to be received in support portions (not shown) of the first substrate 108a to further support the connector body 120 about and with the first substrate 108a.

The connector body 120 can comprise a conductive material (e.g., gold plated aluminum), and the edge launch connector 106a can further comprise a plurality of ground contact pins 126a-e supported by the connector body 120. The ground contact pins 126a-e can be arrayed in any suitable arrangement about the connector body 120. In the example shown, the ground contact pins 126a-e are arrayed in a circle around or about the central support aperture 122, and are each supported within a respective aperture formed in the connector body 120. Thus, the ground contact pins 126a-e can be mechanically and electrically interfaced to the connector body 120 (the connector body 120 being conductive), and the connector body 120 can be electrically coupled to traces (not shown) formed in the substrate 108a about the edge launch connector support portion 114a. In this manner, proper grounding is achieved from the ground contact pins 126a-e, through the connector body 120, to the traces of the first substrate 108a, and to proper/traditional grounding provided by the first circuit board assembly 102a. As further detailed below, ground contact pins 126a-e can each comprise a contact tip (e.g., see contact tip 128 of FIG. 5A) and a compliant device (e.g., see compliant device in the form of a spring 130 FIG. 5A) operable to facilitate axial movement of each respective ground contact pin 126a-e relative to the connector body 120 while being interfaced to a contact pad of the second circuit board assembly 102b. Thus, the ground contact pins 126a-e can each be considered a compliant or spring ground contact pin, or a compliant or spring ground pin, or a compliant or spring pin.

Figure 5A:
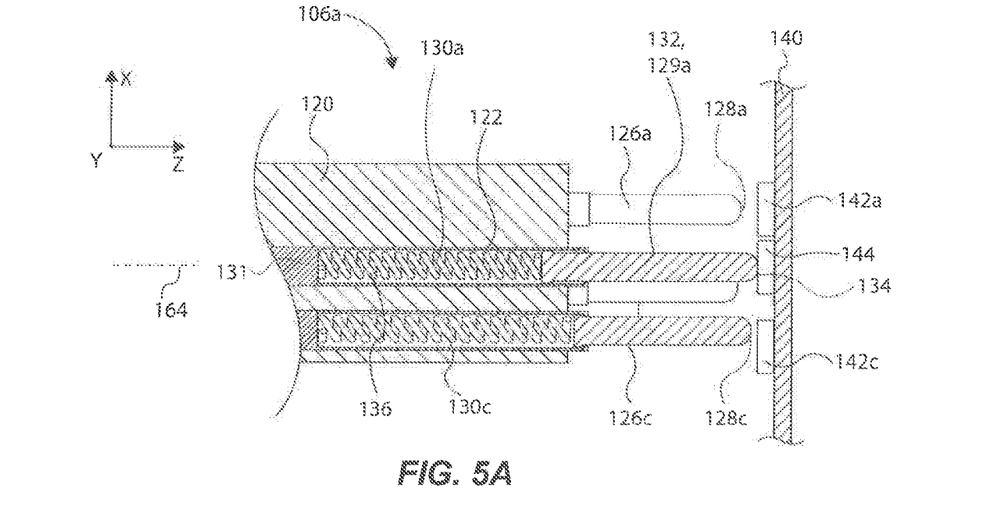
FIG. 5A is a close-up side cross sectional view of one of the edge launch RF signal connectors of FIGS. 1A-4B, showing this in a blind-mate interfacing position relative to contact pads of the second circuit board assembly.

The edge launch signal connector 106a can further comprise a signal pin 132 supported within a support aperture 122 of the connector body 120. In the example shining, the signal pin 132 can be centrally located relative to the arrayed ground contact pins 126a-e, and can be supported within an aperture centrally located relative to the apertures in which the ground contact pins 126a-e are supported. A dielectric sleeve (not shown) can be situated between the support aperture 122 and the signal pin 132 to isolate the signal pin 132 from the (conductive) connector body 120, so that RF signals transferred through the signal pin 132 are not interfered with. As shown in FIG. 5A, the signal pin 132 can comprise a contact tip 134 and a compliant device 136 operable to facilitate axial movement of the signal pin 132 and the contact tip 134 while being interfaced to a contact pad, as further detailed below. Note that in the example shown, the signal pin 132 extends axially beyond the location of the ground contact pins 126a-e, although this particular arrangement may not be necessary, and is not intended to be limiting in any way. Further note that, due to tolerance variations, the ground contact pins 126a-e may be slightly axially situated at different planes relative to each other, meaning that their contact tips may not extend to and terminate at or lie within the same plane, but rather the contact tips can be caused to be in different planes and offset from one another. This is because of the natural effect or result of compounded tolerance variations generated as a result of machining, manufacturing, and/or assembling the components of the RF signal connector(s) 106a and the circuit board assemblies 102a and 102b.

Figure 5B:
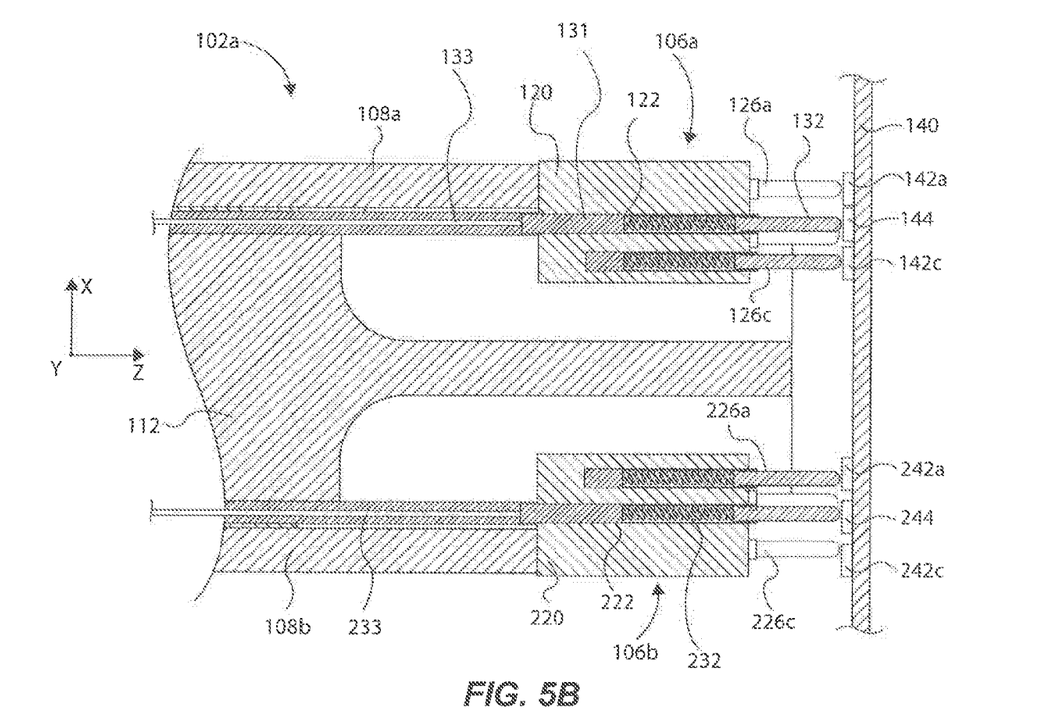
FIG. 5B is a side cross sectional view of the blind-mate coupling area between the circuit board assemblies of FIG. 4A, and showing the edge launch RF signal connector interfaced to the contact pads of the second circuit board assembly.

As can be appreciated from the views of FIGS. 2 and 5B, the first and second edge launch connectors 106a and 106b can be the same or identical (and therefore the second edge launch signal connector 106b will not be labeled or discussed in great detail), but note that the second edge launch connector 106b is supported in a mirror-like configuration or arrangement (in an inverted orientation) compared or relative to the first edge launch signal connector 106b, and supported by the second substrate 108b in a similar manner.

Thus, the term "edge launch" can mean a type of connector (e.g., 106a) that is supported by an edge (e.g., portion 114a) of a substrate (e.g., 108a) of a circuit board assembly (e.g., 102a), and that is configured and positioned so that at least a portion of the connector, namely the electrical contacts (e.g., ground contact pins 126a-e and signal pin 132) of the connector, extends outwardly from the edge of the substrate where they are positioned or situated for coupling to or interfacing with a corresponding electrical contacts on a substrate (e.g., 140) of another or second circuit board assembly oriented transverse to the first circuit board assembly, and wherein the edge launch capability of the connector facilitates blind-mate coupling of the first and second circuit board assemblies.

FIG. 5A illustrates the manner or method in which the edge launch connector 106a (and edge launch connector 106b) can be coupled and interfaced to the second circuit board assembly 102b during assembly, and to achieve the assembled, operating position of FIG. 5B. The second circuit board assembly 102b can comprise a printed circuit board substrate 140 (e.g., an RF collector, or other as will be recognized by those skilled in the art) that includes ground contact pads 142a-e (142a and 142c labeled and shown) that surround or are arrayed around a signal contact pad 144 of the substrate 140, which arrayed arrangement corresponds to, meaning it is the same as or similar to, the arrayed arrangement of the ground contact pins 126a-e and the signal pin 132 of the edge launch connector 106a, such that these can interface with one another, respectively. Accordingly, the arrangement of the ground contact pads 142a-e and the signal contact pad 144 will mimic and align with the arrangement of the ground contact pins 126a-e and the signal pin 132. Alternatively, the ground contact pads 142a-e can instead be a single ground contact pad, such as a ring shaped ground contact pad that surrounds the signal contact pad 144, or even two semi-ring shaped pads that together form a circular configuration.

As shown in FIG. 5A, in response to the edge launch signal connector 106a engaging the second circuit board assembly 102b (when blind-mate coupling the first circuit board assembly 102a to the second circuit board assembly 102b), the contact tip 134 of the signal pin 132 can initially interface with the signal contact pad 144, and such axial pressure or force causes the contact tip 134 to move or displace axially toward the connector body 120, thus compressing the compliant device 136 (e.g., coil spring). Similarly, although not shown in FIG. 5A, once the respective contact tips 128a-e of the ground contact pins 126a-e each interface with the respective ground contact pad 142a-e, such force causes the contact tips 128a-e to move axially toward the connector body 120, thus compressing the respective compliant devices 130a-e, as shown in the compressed positions of FIG. 5B where the ground contact pins 126a-e are interfaced to respective ground contact pads 142a-e (or where all the ground contact pins 126a-e are interfaced to a single ring-shaped ground contact pad, in the alternative mentioned above). Thus, the compliant devices 130a-e can each apply a biasing force or spring force against the respective contact tips 128a-e when axially moved, thereby at least partially compressing the compliant devices 130a-e.

Each contact pin disclosed herein (e.g., 126a-e, 132, 226a-e, and 232) can include a movable contact body (including the contact tip), a contact support body, and the compliant device (e.g., see the movable contact body 129, the contact support body 131, and the compliant device 136 of signal pin 132). Using the signal pin 132 as an example for discussion purposes, the ground contact pins 126a-e not being specifically discussed, but similarly configured), its movable contact body 129 can be slidable or translatable through a bore of the contact support body 131, and the compliant device 136 can be seated between the movable contact body 129 and the support contact body 131. In this configuration, the compliant device 136 is configured or operable to apply an outward biasing force to the movable contact body 129, so that it may be compressed when a force is applied to the movable contact body 129 (i.e., when being interfaced to a contact pad upon connection of the first circuit board assembly 102a to the second circuit board assembly 102b). As can be appreciated from FIGS. 5A and 5B, the support contact body 131 can be coupled to an RF coaxial cable 133, which can be coupled to electrical components of the first circuit board assembly 102a (e.g., antenna devices) for transferring RF signals. Note that other configurations of "spring pins" (e.g., 126a-e, 132, 226a-e, and 232) are possible and contemplated herein; however, a common or generic configuration includes a movable body translatable relative to another body, with a compliant device situated therebetween for applying a biasing force to interface the movable body to a contact pad to achieve electrical and mechanical connection.

Notably, because of the aforementioned tolerance variations of the ground contact pads 142a-e relative to each other (and because of other positional tolerance variations of other connections (e.g., pins 103 of FIGS. 1A and 1B)), one or more of the ground contact pins 126a-e can contact a respective ground contact pad 142a-e before one or more of the other or remaining contact pin(s) contact their respective ground contact pad(s). This is somewhat illustrated in FIG. 5A, where ground contact pin 126c is shown to be in closer proximity to its corresponding contact pad 142c compared to the position of the ground contact pin 126a relative to its corresponding contact pad 142a. Upon connection of the first circuit board assembly 102a to the second circuit board assembly 102b, the ground contact pin 126c will engage and interface with or contact the contact pad 142c before the ground contact pin 126a engages or contacts the contact pad 142a. However, because of the inclusion of the compliant devices 130a-e in the ground contact pins 126a-e, the edge launch connector 106a provides "axial float" of the ground contact pins 126a-e in the z direction (the z direction being in a direction along an axis normal to the surface of the second circuit board assembly 102b). The axial float of any one ground contact pin of the plurality of ground contact pins 126a-e can be made relative to the other ground contact pins of the plurality of ground contact pins 126a-e, so that eventually all of the ground contact pins 126a-e will be interfaced to their respective ground contact pads 142a-e despite their initial starting or extended position.

Such described "axial float" facilitated by the ground contact pins 126a-e can be provided by a contact tolerance float system, which can be defined as a float system that provides float in at least one direction (e.g., the z axis direction of such "axial float") for the electro-mechanical interface between the ground contact pins 126a-e and their respective ground contact pads 142a-e. Therefore, the contact tolerance float system can comprise the plurality of ground contact pins 126a-e to facilitate axial movement of the ground contact tips 128a-e relative to the connector body 120, as further discussed herein. The contact tolerance float system can further comprise the signal pin 132 operable to facilitate axial movement of the contact tip 134 relative to the connector body 120, as further discussed herein. Thus, the ground contact pins 126a-e and the signal pin 132 can be at least partially compressed to facilitate axial float between the first and second circuit board assemblies 102a and 102b along an axis normal to a board surface 160 of the second circuit board assembly 102b, thereby accounting for axial positional tolerances between the first and second circuit board assemblies 102a and 102b.

Note that, when in the extended positions (e.g., not interfaced to pads), because of tolerance variations, some or all of the ground contact pins 126a-e of the first edge launch connector 106a as supported by the first circuit board assembly 102a may be positioned on one or more different planes (x axis planes) relative to the ground contact pins 226a-e of the second edge launch connector 106b also supported by the first circuit board assembly 102a (i.e., not all of the ground contact pins will be perfectly or exactly aligned along the x axis plane because of machining and assembly tolerance variations). Because of such tolerance variations, at least some of the ground contact pins 126a-e and 226a-e might interface respective ground contact pads 142a-e and 242a-e at different periods in time during blind-mate coupling of the first and second circuit board assemblies 102a and 102b. Again, this is due to the natural or predictable tolerance variations of the pins, connector bodies, circuit boards, contact pads, substrates, etc., (when being manufactured and assembled) that can all contribute to compounded positional tolerance variation in the z axis direction (and other directions) of the ground contact pins 126a-e and 242a-e relative to each other. However, the aforementioned axial float in the z direction helps to accommodate such positional tolerance variations of the sets of ground contact pins 126a-e and 226a-e relative to each other, because the ground contact pins 126a-e and 226a-e are biased by a spring force (i.e., can be referred to as spring pins). In other words, each ground contact pin has a compliant device operable to bias the contact pin and to provide and apply the spring force to facilitate axial movement of the contact tip when interfacing and interfaced to respective ground contact pads.

The same "axial float" principle holds true with regards to the signal pin 132 (and 232), because the signal pin 132 also comprises a compliant device 136 that provides a spring force, and that allows for axial float of the signal pin 132 in the z direction when being interfaced to the signal contact pad 144. This is advantageous when coupling a plurality of edge launch signal connectors, like 106a and 106b, supported by the first circuit board assembly 102a. Thus, the contact tolerance float system can further comprise the signal pin, and can further define "axial float" in the z direction between the signal pin 132 of the first edge launch signal connector 106a, and a signal pin 232 of the second edge launch signal connector 106b (FIG. 5B). Therefore, if the signal pin 132 is in a different axial position along the z axis relative to the axial position of the signal pin 232 (when both pins are fully extended and not interfaced to pads), the compliant devices 136 and 236 provide axial float in the z direction for the respective signal pins 132 and 232. This ensures that both signal pins 132 and 232 make proper electro-mechanical connection to respective signal pads 144 and 244 of the second circuit board assembly 102b despite the positional tolerance variations that may result in different axial positions of the signal pins 132 and 232 relative to each other.

The contact tolerance float system can further include or define or comprise an amount of "radial float" in both the x and y axial directions for pins (e.g., 126a-e and 132) of each of the first and second edge launch signal connectors 106a and 106b, and for both of the first and second edge launch signal connectors 106a and 106b relative to each other. For instance, because the ground contact pads 142a-c and the signal contact pads 144 have generally flat or linear contact surfaces (i.e., being flat trace or solder pads), the ground contact pins 126a-e, having rounded or flat tips, are allowed to slightly move or slide radially in the x and y axial directions while being electro-mechanically interfaced to their respective contact pads to account for positional tolerances in such xy axial directions. This is illustrated by the position of the contact pad 142c being off-center relative to a central axis of the ground pin 126c. Accordingly, if one or more ground pins are off-center relative to a receiving contact pad, the configuration of the interface between the contact tips 128 (round or flat) and the (flat) ground contact pads 142a-e accommodates for such off-center interface. In other words, because there is no "snap" or "lock" or insertion of the pins into an aperture, or other structurally supporting interface between the ground pins 126a-e and the contact pads 142a-e, the ground pins 126a-e are permitted to be in different xy position(s) relative to each other and to the respective contact pads 142a-e (or a single ring contact pad), but still make effective electrical and mechanical contact together. This is beneficial over traditional 3-part RF connectors that require one connector body to snap or lock onto another connector body (e.g., the bullet). Thus, the present edge launch signal connectors are not dependent or reliant on an exact positional arrangement of the circuit boards or the connectors/pads and corresponding electrical contacts between them, which "frees up" other connections (e.g., pins 103) that may have or require more precise positioning coupling to connector while being blind-mate coupled, for instance. Note that a particular edge launch connector may be considered to have "1 part" to make RF connection, namely the 1 part being the collection of pins (ground and signal pins).

Therefore, the contact tolerance float system can further comprise the at least one ground contact pad (e.g., contact pads 142a-e, or a single ring ground contact pad) and the plurality of ground contact pins 126a-e that interface together to provide a plurality of ground electro-mechanical interfaces that facilitate radial float between the first and second circuit board assemblies 102a and 102b in different directions along different axes (e.g., x and y axes) parallel to the surface 160 of the second circuit board assembly 102b, thereby accounting for radial positional tolerances, as further detailed herein.

The contact tolerance float system can further comprise the signal pad 144 and the signal pin 132 that interfaces with the signal pad 144 to provide or generate a signal electro-mechanical interface that further facilitates radial float between the first and second circuit board assemblies 102a and 102b in different directions along different axes parallel to the surface 160 of the second circuit board assembly 102b, thereby accounting for radial positional tolerances, as further detailed herein. In one example, the signal contact pad 144 can be "oversized", meaning that it can have a surface area larger than at least twice the size of a cross-sectional area of the movable contact body 129 of the signal pin 132. In one example, the area of the signal contact pad 144 can be 2-3 times the cross-sectional area of the contact body 129 of the signal pin 132. Of course, still larger sizes are possible and contemplated herein. This can further define the contact tolerance float system discussed above. In this manner, the signal pin 132 can be off-center relative to a center point of the signal contact pad 144, but still make electro-mechanical interfacing or contact because the signal contact pad 144 is oversized to accommodate or relax positional tolerance variations in one or more radial directions that may affect the positional interface between the signal pin 132 and the signal contact pad 144.

The same "radial float" concept is true for the ground contact pins 126a-e and the corresponding contact pads 142a-e. That is, the contact tips 128 of the ground contact pins 126a-e, and the contact tip 134 of the signal contact pin 132, do not need to be exactly aligned with their respective contact pads 142a-e and 144, because the contact tips 128 and contact tip 134 are allowed to slide or move axially in the x and/or y axial directions because of the rounded (or flat) shape of the pins 126a-e and 144, and because of the flat surfaces of the contact pads 142a-e and 144. This is particularly useful when a number of other peripheral contacts (e.g., 103) of the first circuit board assembly 102a, having tighter or stricter positional tolerance requirements, are concurrently being coupled to mating contacts of the second circuit board assembly 102b. This is because the relative positions of the edge launch signal connector(s) between the first and second circuit board assemblies 102a and 102b are not dependent on the mating interfaces of such peripheral contacts between the first and second circuit boards 102a and 102b, because the edge launch signal connector(s) facilitate axial and radial float, as discussed herein. Thus, the contact tolerance float system of a single particular edge launch signal connector (e.g., 104a) can provide float in each of the xyz axial directions.

The contact tolerance float system can further provide or comprise rotational float in the xy rotational directions, in cases where the ground contact pins 126a-e and the signal contact pin 132 may be radially misaligned relative to the receiving contact pads 142a-e and 144. This "rotational float" in the xy rotational directions is facilitated by the fact that the contact tips 128 and 134 are rounded or curved, and that the contact pads 142a-e and 144 are flat, so that the contact tips 128 and 134 can somewhat roll or pivot about the contact pads 142a-e and 144 if such radial misalignment exists, and while still providing proper electro-mechanical connection between the contact pins 126a-e and 132 and their receiving contact pads 142a-e and 144.

In addition, the contact tolerance float system can provide or comprise axial float and radial float between the edge launch signal connectors 106a and 106b relative to each other. More specifically, as noted above, positional tolerances may exist between different edge launch signal connectors 106a and 106b in each of the xyz axial direction, and even in the xy rotational directions. Similarly as noted above, because of the electro-mechanical interface between the contact tips (e.g., 126a-e and 132) and the respective contact pads (e.g., 142a-e and 144), the contact tips 128a-e and 134 of the first edge launch signal connector 106a can axially slide in the xy directions along their respective contact pads 142a-e and 144 to accommodate for positional tolerances that may exist between the contact pins 226a-e and 232 of the second edge launch signal connector 106b and that of the first edge launch signal connector 106a. In this way, two or more edge launch signal connectors (e.g., 106a and 106b) of one particular circuit board assembly (e.g., 102a) can be blind-mate coupled to another circuit board assembly (e.g., 102b) despite or independent of positional tolerance variations that may exist, as detailed above.

As illustrated in FIG. 4B, the substrate 140 of the second circuit board assembly 10 can comprise a board surface 160 that supports the contact pads 142a-e and 144, and that extends along a first plane X1. And, the first substrate 108a of the first circuit board assembly 102a (that supports the edge launch connector 106a) can comprise a board surface 162 that extends along a second plane Z1 that is transverse (e.g., generally orthogonal) to the first plane X1. Note that the signal pin 132 of FIG. 5A can define a longitudinal axis 164 that is generally parallel to the surface 162 and the second plane Z1 and normal to the surface 160 and the plane X1 of the substrate 140, which is consistent with the edge launch configuration of the edge launch signal connector 106a.

As mentioned above, the RF connections of the present disclosure eliminate the need for solder points, which are required in prior/traditional RF connections that have "a bullet" soldered to pads of a substrate of an RF collector. By eliminating such solder points, and by reducing from 3 parts (prior art) to 1 part (the collection of spring pins of the present disclosure), the present RF connectors reduce or minimize RF losses as compared to the 3-part RF connectors of the prior art, because additional components all contribute to RF losses (e.g., solder points, and additional parts such as the bullet). The reduction from 3 parts to 1 part (the collection of ground and signal pins) further dramatically reduces costs for parts and labor when assembling an electronics assembly, particularly where dozens or hundreds of parts are eliminated on larger antenna arrays, for instance.

Reference was made to the examples illustrated in the drawings and specific language was used herein to describe the same. It will nevertheless be understood that no limitation of the scope of the technology is thereby intended. Alterations and further modifications of the features illustrated herein and additional applications of the examples as illustrated herein are to be considered within the scope of the description.

Although the disclosure may not expressly disclose that some embodiments or features described herein may be combined with other embodiments or features described herein, this disclosure should be read to describe any such combinations that would be practicable by one of ordinary skill in the art. The use of "or" in this disclosure should be understood to mean non-exclusive or, i.e., "and/or," unless otherwise indicated herein.

Furthermore, the described features, structures, or characteristics may be combined in any suitable manner in one or more examples. In the preceding description, numerous specific details were provided, such as examples of various configurations to provide a thorough understanding of examples of the described technology. It will be recognized, however, that the technology may be practiced without one or more of the specific details, or with other methods, components, devices, etc. In other instances, well-known structures or operations are not shown or described in detail to avoid obscuring aspects of the technology.

Although the subject matter has been described in language specific to structural features and/or operations, it is to be understood that the subject matter defined in the appended claims is not necessarily limited to the specific features and operations described above. Rather, the specific features and acts described above are disclosed as example forms of implementing the claims. Numerous modifications and alternative arrangements may be devised without departing from the spirit and scope of the described technology.

What is claimed is:

1. An edge launch radio frequency (RF) signal connector, comprising:
   a connector body having central support aperture and one or more interface surfaces operable to interface with an edge launch connector support portion of a first circuit board;
   a plurality of ground contact pins supported by the connector body and arrayed about the support aperture of the connector body, each ground contact pin comprising a contact tip and a compliant device operable to facilitate axial movement of the ground contact tip relative to the connector body; and
   a signal pin supported within the central support aperture of the connector body, the signal pin comprising a contact tip and a compliant device operable to facilitate axial movement of the contact tip,
   wherein, in response to the edge launch RF signal connector engaging a second circuit board, the plurality of ground contact pins interface with at least one ground contact pad of the second circuit board, and the signal pin interfaces with a signal contact pad of the second circuit board.

2. The edge launch RF signal connector of claim 1, wherein at least some of the plurality of ground contact pins can have respective contact tips located in different planes relative to each other, whereby the compliant devices of the at least some of the plurality of ground contact pins operate to bias the contact tips when interfaced to the at least one ground contact pad to account for positional tolerances.

3. The edge launch RF signal connector of claim 1, wherein the plurality of ground contact pins and the signal contact pin are movable between extended positions and compressed positions.

4. The edge launch RF signal connector of claim 3, wherein, when in the extended positions, the contact tip of the signal pin axially extends beyond the contact tips of the ground contact pins.

5. The edge launch RF signal connector of claim 1, wherein the plurality of ground contact pins are arrayed in a circle around the signal pin, and wherein the at least one ground contact pad comprises a ring shaped pad that surrounds the signal contact pad.

6. An electronics assembly, comprising:
a first circuit board assembly comprising at least one edge launch connector support portion;
a second circuit board assembly comprising at least one signal contact pad and at least one ground contact pad surrounding the signal contact pad, the first circuit board assembly being blind-mate connected to the second circuit board assembly; and
an edge launch RF signal connector that facilitates the blind-mate connection of the first and second circuit board assemblies, the edge launch RF signal connector comprising a connector body supported by the connector support portion of the first circuit board assembly, the connector body supporting a plurality of ground contact pins biased to the at least one ground contact pad via a spring force, and supporting a signal pin biased to the signal contact pad via a spring force, to account for positional tolerances between the first and second circuit board assemblies.

7. The electronics assembly of claim 6, further comprising a contact tolerance float system comprising:
the plurality of ground contact pins, wherein each ground contact pin comprises a contact tip and a compliant device operable provide a respective spring force, and to facilitate axial movement of the ground contact tip relative to the connector body; and
the signal pin, wherein the signal pin further comprises a contact tip and a compliant device operable to facilitate axial movement of the contact tip to apply the spring force,
wherein the ground contact pins and the signal pin are at least partially compressed to facilitate axial float between the first and second circuit board assemblies along an axis normal to a surface of the second circuit board assembly, thereby accounting for axial positional tolerances.

8. The electronics assembly of claim 6, wherein the contact tolerance float system further comprises:
the at least one ground contact pad, wherein the plurality of ground contact pins interface with the at least one ground contact pad to provide a plurality of ground electro-mechanical interfaces; and
the signal pad, wherein the signal pin interfaces with the signal pad to provide a signal electro-mechanical interface,
wherein the ground electro-mechanical interfaces and the signal electro-mechanical interface facilitate radial float between the first and second circuit board assemblies in different directions along different axes parallel to the surface of the second circuit board assembly, thereby accounting for radial positional tolerances.

9. The electronics assembly of claim 6, wherein the first circuit board assembly is oriented generally orthogonally relative to the second circuit board assembly.

10. The electronics assembly of claim 6, wherein the first circuit board assembly comprises a first substrate and a second substrate, wherein the first substrate supports the edge launch RF signal connector, and wherein the second substrate supports a second edge launch RF signal connector.

11. The electronics assembly of claim 10, wherein the second edge launch RF signal connector comprises a second connector body supported by a second connector support portion of the second substrate, the second connector body supporting a plurality of ground contact pins biased to at least one second ground contact pad of the second circuit board assembly, and supporting a signal pin biased to a second signal contact pad of the second circuit board assembly.

12. The electronics assembly of claim 6, further comprising a plurality of first circuit board assemblies spatially separated from each other and each electrically coupled to the second circuit board assembly, wherein each of the first circuit board assemblies supports at least one edge launch RF signal connector.

13. The electronics assembly of claim 6, wherein the first circuit board assembly comprises a plurality of peripheral contacts operable to contact respective contact interfaces within the positional tolerances accounted for by the edge launch RF signal connector.

14. The electronics assembly of claim 6, wherein the signal pin comprises a longitudinal central axis generally parallel to a board surface of the first circuit board assembly.

15. The electronics assembly of claim 6, wherein the electronics assembly comprises an antenna array assembly comprising a plurality of first circuit board assemblies each comprising a pair of edge launch RF signal connectors, and each of the plurality of first circuit board assemblies being blind-mate coupled to the second circuit board assembly via the respective pairs of edge launch RF signal connectors.

16. A method for accounting for positional tolerances between blind-mated circuit boards with edge launch RF signal connectors, comprising:
coupling at least one edge launch RF signal connector to a first circuit board assembly, the at least one edge launch RF signal connector comprising a connector body supporting a plurality of ground contact pins and a signal pin each having contact tips operable to axially move via a compliant device in response to a biasing force;
obtaining a second circuit board assembly having a printed circuit board substrate comprising at least one ground contact pad and a signal contact pad; and
interfacing the signal pin to the signal contact pad, and interfacing the ground contact pins to the at least one ground contact pad, such that the contact tips of the signal pin and the ground contact pins axial move via the compliant devices while blind-mate coupling the first circuit board assembly to the second circuit board assembly to accommodate for positional tolerances.

17. The method of claim 16, further comprising coupling a plurality of first circuit board assemblies to the second circuit board assembly, such that the first circuit board assemblies are spatially separated from each other and oriented generally orthogonal relative to the printed circuit board substrate of the second circuit board assembly, wherein each of the first circuit board assemblies supports at least one edge launch RF signal connector interfaced to the respective ground contact pads and the signal contact pad of the printed circuit board substrate, wherein each edge launch RF signal connector facilitates float of the first circuit board assembly in three directions relative to the second circuit board assembly.

18. The method of claim 16, wherein the compliant devices are operable to facilitate axial movement of the respective contact tips, such that the contact tips of the ground contact pins and the signal pin are operable to axially move while being interfaced to the printed circuit board substrate to account for positional tolerances.

19. The method of claim 16, wherein interfacing the signal pin to the signal contact pad, and interfacing the ground contact pins to the at least one ground contact pad, further comprise radially moving the edge launch RF signal connector in two directions relative to the second circuit board assembly while being interfaced to the printed circuit board substrate to account for positional tolerances.

20. The method of claim 16, further comprising assembling an antenna array assembly comprising a plurality of first circuit board assemblies each comprising a pair of edge launch RF signal connectors that facilitate blind-mate connection of the first circuit board assembly to the second circuit board assembly.

* * * * *